(12) United States Patent
Flottmann et al.

(10) Patent No.: US 6,313,013 B1
(45) Date of Patent: Nov. 6, 2001

(54) METHOD AND DEVICE FOR PROCESSING SEMICONDUCTOR MATERIAL

(75) Inventors: Dirk Flottmann, Altötting; Gerhard Ast; Reinhard Wolf, both of Emmerting, all of (DE)

(73) Assignee: Wacker-Chemie GmbH, München (DE)

( * ) Notice: Subject to any disclaimer, the term of this patent is extended or adjusted under 35 U.S.C. 154(b) by 0 days.

(21) Appl. No.: 09/410,623

(22) Filed: Oct. 1, 1999

(30) Foreign Application Priority Data

Oct. 13, 1998 (DE) .............................. 198 47 098

(51) Int. Cl.[7] .......................... H01L 21/322; H01L 21/00
(52) U.S. Cl. ............................. 438/472; 438/800
(58) Field of Search .................... 438/472, 800; 241/1, 23, 24, 15, 18

(56) References Cited

U.S. PATENT DOCUMENTS

| | | | |
|---|---|---|---|
| 4,820,650 | * 4/1989 | Nagae et al. | 437/10 |
| 4,871,117 | 10/1989 | Baueregger et al. | |
| 4,883,775 | * 11/1989 | Kobayashi | 437/225 |
| 5,013,693 | * 5/1991 | Guckel et al. | 437/248 |
| 5,348,893 | * 9/1994 | Yamagishi | 437/10 |
| 5,443,863 | * 8/1995 | Neely et al. | 427/579 |
| 5,464,480 | * 11/1995 | Matthews | 134/1.3 |
| 5,660,335 | * 8/1997 | Kö ppl et al. | 241/1 |
| 6,063,697 | * 5/2000 | Wolf et al. | 438/472 |

FOREIGN PATENT DOCUMENTS

| | | |
|---|---|---|
| 19716374 | 10/1998 | (DE) . |
| 0273628 | 7/1988 | (EP) . |
| 0856599 | 8/1998 | (EP) . |
| 10144652 | 5/1998 | (JP) . |

OTHER PUBLICATIONS

English Derwent Abstract [AN 1998–558468 [48]] Corresp. to DE 19716374.

Patent Abstracts of Japan, vol. 1996, No. 07, Jul. 31, 1996 & JP 08 064662 A (Nomura Micro Sci Co Ltd) Mar. 8, 1996.

English Abstract Corresponding to JP 10–144652.

* cited by examiner

*Primary Examiner*—John F. Niebling
*Assistant Examiner*—Walter L. Lindsay, Jr.
(74) *Attorney, Agent, or Firm*—Collard & Roe, P.C.

(57) ABSTRACT

There are a device and method for protecting semiconductor material, wherein semiconductor material is processed on a surface of stabilized ice made from ultrapure water and particles of semiconductor material.

7 Claims, No Drawings

US 6,313,013 B1

METHOD AND DEVICE FOR PROCESSING SEMICONDUCTOR MATERIAL

BACKGROUND OF THE INVENTION

1. Field of the Invention

The present invention relates to a device for protecting semiconductor material and to a method for protecting semiconductor material.

2. The Prior Art

High-purity semiconductor material is required for the production of solar cells or electronic components, such as for example storage elements or microprocessors. It is therefore desired to keep the concentrations of harmful contaminants as low as possible. It is often observed that semiconductor material which has already been produced to a high purity level is contaminated again during further processing to give the target products. For this reason, expensive cleaning steps are required again and again in order to restore the original purity. By way of example, foreign metal atoms which are incorporated in the crystal lattice of the semiconductor material interfere with the charge distribution and may reduce the ability of the subsequent component to function or may even lead to this component failing. Consequently, metallic contamination of the semiconductor material is to be particularly avoided. This is true in particular of silicon, which is the most frequently used semiconductor material in the electronics industry.

High-purity silicon is obtained, for example, by thermal decomposition of silicon compounds which are readily volatile and are therefore easy to purify by distillation methods, such as for example trichlorosilane.

To produce high-purity silicon using the most frequently employed Siemens method, a mixture of trichlorosilane and hydrogen is guided over thin silicon rods, which are heated by direct current passage to approximately 1100° C., in a quartz reactor. The result is polycrystalline silicon in the form of rods with typical diameters of from 70 to 300 mm and lengths of from 500 to 2500 mm. The polycrystalline silicon is used to produce single crystals which are pulled from crucibles, strips and sheets or to produce polycrystalline solar-cell base material.

For the production of these products, it is necessary to melt solid silicon in crucibles. In order to achieve a high filling level in the crucibles and, in this way, to make the melting operation as efficient as possible, the abovementioned polycrystalline silicon rods have to be comminuted and then separated before being melted. Usually, this inevitably entails contamination to the surface of the semiconductor material, since the comminution is carried out using metallic crushing tools, such as jaw crushers or roll crushers, hammers or chisels on bases made from materials such as steel or plastic. Also, the subsequent separation operation usually takes place on screens made from metal or plastic. Therefore, during the comminution operation and the separation step, the silicon is contaminated by metals or carbon from the tools and the base. To eliminate this contamination, the fragments have to be subjected to complex and expensive surface cleaning, such as for example by etching with HF/HNO$_3$, before being melted.

Therefore, silicon bases and tools made from silicon or with silicon coatings are used to reduce the contamination during comminution. Screens made from silicon or silicon-coated screens also form part of the prior art for the separation operation. However, these have the drawback that they are damaged or destroyed by the transmission of forces during the comminution operation (striking with hammers) or in the separation operation, and have to be replaced. On average, a base is able to take approximately 10 to 15 batches (corresponding to approximately 10 to 15 t) both during crushing and during screening. Then, broken pieces (approx. 30%) have to be replaced, so that fragments of the base do not enter the material which is to be sold.

Furthermore, these silicon bases have to be disposed of, entailing further costs, since this material is cracked or has been comminuted to undesirable fragment sizes, and therefore can no longer be sold. The production of such a base requires additional deposition of silicon, mechanical operations involved in the production of the shaped parts and complex cleaning thereof, for example by etching with HF/HNO$_3$.

SUMMARY OF THE INVENTION

It is therefore an object of the present invention to overcome the drawbacks of the prior art and to provide a device and a method which reduce the additional contamination of semiconductor material during comminution, separation or during transport. This object is achieved by means of the invention.

One embodiment of the invention is a device for protecting semiconductor material, wherein semiconductor material is situated on a surface of stabilized ice, produced from ultrapure water and semiconductor particles.

The semiconductor material from which the stabilized layer of ice is produced is advantageously the same material which is to be protected by the device according to the invention.

Examples of semiconductor materials are silicon, germanium or gallium arsenide with silicon, in particular ultrapure polysilicon, being preferred.

The device according to the invention is formed by stabilized ice which can be produced from ultrapure water and particles of semiconductor material. This stabilized ice is preferably situated on the surface of a support, such as for example a substrate made from steel, plastic, a semiconductor material, such as for example silicon, or some other suitable material. However, the stabilized ice made from ultrapure water and semiconductor particles may also form a self-supporting block.

This stabilized ice is produced by being deposited on a support, such as a substrate made from steel, plastic, a semiconductor material, such as for example preferably silicon, or some other suitable material. Pipes are attached to the underside of the support, through which pipes a cooling liquid flows, such as for example preferably an aqueous potassium carbonate solution. In order for the support to be cooled better, the pipes preferably lie in a thermally conductive paste. In order to save energy, that side of the pipes which faces away from the support is usually insulated. In a refrigerating machine, the cooling liquid is cooled to preferably below −10° C. and particularly preferably to below −25° C. and is pumped through the pipes of the support.

During the cooling operation and in the following period, the surface of the base is sprayed with ultrapure water which has a specific conductance of preferably less than 0.01 $\mu$S/cm. During spraying, particles of semiconductor material, in particular in the form of dust or granules, are continuously or entirely discontinuously, as desired, added to the layer of ice which is being formed, for example by being scattered onto the ice. The particles of semiconductor material which are added to the layer of ice are formed preferably having a diameter of from 10 μm to 5 mm, particularly preferably between 500 μm and 2000 μm.

When the layer has grown preferably to a thickness of from 0.5 cm to 30 cm, particularly preferably to 5 cm to 20 cm, in particular to 5 cm to 10 cm, the semiconductor material which is to be protected is placed on the layer of stabilized ice.

This semiconductor material may also be placed onto a block of self-supporting ice made from ultrapure water and semiconductor particles or may be frozen into this block, in order, for example, for it to be transported.

Preferably, in the device according to the invention, the semiconductor particles form between 5 and 70% by weight, particularly preferably between 15 and 35% by weight, of the layer of ice, based upon the total weight of the layer of ice.

Preferably, the semiconductor material, such as for example silicon rods produced using the Siemens method, is placed on the layer of stabilized ice, in order to be comminuted on this ice made from ultrapure water and semiconductor particles using contamination-free crushing methods, such as for example with a hammer made from ultrapure silicon. Comminution between two layers of stabilized ice which are suddenly struck together is also conceivable.

Then, the resultant ice-silicon mixture is pushed onto a heated silicon base using a silicon slide and is dried by means of radiant heaters. Then, after the drying process, it is possible, for example, for the conventional separation on silicon screens to take place. Usually, the silicon particles contained in the ice are separated from the semiconductor material which has been comminuted using the crushing method according to the invention. This separation may, for example, be carried out by screening. However, the silicon particles may also be blown out of the semiconductor product using air.

A further embodiment of the invention is a device according to the invention for protecting semiconductor material, wherein the device is a separation device.

Furthermore, a separation operation may also take place on a screen which is coated with stabilized ice made from ultrapure water and semiconductor particles. However, for a perfect separation result, it is necessary for the stabilized ice to be separated out of the ice-silicon mixture formed during comminution. This may, for example, be achieved by briefly heating the mixture on a silicon base to above the melting point of water. After the separation has taken place, the drying operation described above then takes place. Here too, the silicon particles contained in the ice are usually separated from the semiconductor material obtained in the separation method according to the invention. This may, for example, again be carried out by means of screening. However, the silicon particles may also be blown out of the semiconductor product using air.

Semiconductor material for the known float zone method, such as for example silicon rods, may be embedded in the device according to the invention for machining, for example for cutting to length, cone-grinding.

Removal aids for removing the silicon rods from the Siemens reactor may also be produced and used in the form of the device according to the invention.

Furthermore, the device according to the invention, which rests on a substrate made preferably from steel, may be used for compact embedding of silicon rods and for removing the graphite electrode therefrom without contaminating the rod with carbon.

The device according to the invention has the advantage that the stabilized ice, due to the inclusion of preferably ultrapure semiconductor material in the pure ice layer, has a very long service life, since stresses are reduced compared to a layer of ice made from ultrapure water.

A method for protecting semiconductor material which uses a device according to the invention forms a further embodiment of the invention.

It is desirable that the layer of stabilized ice is cooled when the method according to the invention is being carried out, in order to prevent the layer from thawing.

Furthermore, it is advantageous, in the case of relatively long operating times, to spray the layer of stabilized ice continuously or discontinuously with ultrapure water, in order to replace the ice which is abraded. During this regeneration operation, it is possible, if desired, for particles of semiconductor material to be added as well. However, this addition is not preferable, since usually, during the treatment operations, such as crushing or separation, fine semiconductor particles are formed in any case, and these are deposited with the water used for regeneration.

A preferred embodiment is a method for protecting semiconductor material in which the semiconductor material, preferably silicon, is comminuted. The advantage of this comminution on the device according to the invention is that the material to be comminuted cannot be contaminated further. In addition, the substrate used for comminution can easily be separated from the semiconductor material and disposed of, since the stabilized ice made from ultrapure water and semiconductor particles is easily melted, resulting in an extremely environmentally friendly method. If the support on which the stabilized ice is situated is silicon, this is particularly preferred. This is because if the stabilized ice should happen to be damaged, so that the semiconductor material situated thereon, in the form of silicon, comes into contact with the support, the semiconductor material which is to be comminuted is not contaminated further.

DETAILED DESCRIPTION OF PREFERRED EMBODIMENTS

Other objects and features of the present invention will become apparent from the following detailed description considered in connection with the accompanying examples of the present invention. It should be understood, however, that the examples are designed for the purpose of illustration only and not as a definition of the limits of the invention.

EXAMPLE 1 (COMPARATIVE)

Pipe coils were welded onto the underside of a steel plate with a frame (length 80 cm, width 50 cm; frame height 5 cm). Cooling brine at a temperature of −15° C. was fed through these pipes, in order to cool the steel plate. A compact layer of ice of 4 cm on average was produced within 75 minutes by spraying on cold ultrapure water (8° C.).

Polysilicon rods with a diameter of 135 mm were comminuted on this layer by being pounded with a silicon hammer. The desired fragment size was between 40 and 120 mm. After 142 kg of silicon had been comminuted in 45 minutes, the layer of ice revealed cracks which were so large that contamination of the polysilicon by the steel substrate support was inevitable. The test was then terminated.

EXAMPLE 2 (INVENTION)

After the substrate support had been thawed, it was cooled in the same way. Then, ultrapure water was again sprayed onto the cold steel plate. Now, however, 3.5 kg of silicon granules with an average particle size of 952 µm were scattered on in a total of five steps while the layer of ice was being built up. After all the silicon had been scattered on, water alone continued to be sprayed on for a further 15 minutes. The entire operation this time lasted 65 minutes. The resultant layer thickness was again on average 4 cm.

As in the first test, polysilicon rods with a diameter of 128 mm were comminuted on the layer produced in this way. This time, it was 70 minutes before the cracks became so large that contamination of the polysilicon by the steel substrate support was inevitable. By this time, 232 kg of silicon had been comminuted.

Accordingly, while a few embodiments of the present invention have been shown and described, it is to be understood that many changes and modifications may be made thereunto without departing from the spirit and scope of the invention as defined in the appended claims.

What is claimed is:

1. A device for protecting semiconductor material, comprising
    a surface of stabilized ice made from ultrapure water and semiconductor particles, on which semiconductor material is situated.

2. The device for protecting semiconductor material as claimed in claim 1,
    wherein the semiconductor material is silicon.

3. The device for protecting semiconductor material as claimed in claim 1,
    wherein the ultrapure water used to produce the ice surface has a conductance of less than 0.1 µS/cm.

4. A device for protecting semiconductor material, comprising
    a surface of stabilized ice made from ultrapure water and semiconductor particles, on which semiconductor material is situated; and
    a support having a surface of stabilized ice made from ultrapure water and semiconductor particles.

5. The device for protecting semiconductor material as claimed in claim 4,
    wherein the support consists of silicon.

6. The device for protecting semiconductor material as claimed in claim 1, further comprising
    means for separating fragments of semiconductor material.

7. The device of claim 1,
    wherein the surface is self-supporting.

* * * * *